United States Patent
Suzuki et al.

(10) Patent No.: US 7,646,221 B2
(45) Date of Patent: Jan. 12, 2010

(54) BUFFER CIRCUIT AND CONTROL METHOD THEREOF

(75) Inventors: Toyoki Suzuki, Kasugai (JP); Mitsuaki Tomida, Kasugai (JP); Shuuichi Nagaya, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/902,567

(22) Filed: Sep. 24, 2007

(65) Prior Publication Data

US 2008/0079475 A1 Apr. 3, 2008

(51) Int. Cl.
*H03B 1/00* (2006.01)
*H03K 3/00* (2006.01)

(52) U.S. Cl. ................................. 327/112
(58) Field of Classification Search ............... 327/112
See application file for complete search history.

(56) References Cited

U.S. PATENT DOCUMENTS

| | | | | |
|---|---|---|---|---|
| 5,548,237 A * | 8/1996 | Iadanza et al. | ............... | 327/281 |
| 5,663,670 A * | 9/1997 | Iadanza et al. | ............... | 327/281 |
| 5,770,960 A * | 6/1998 | Iadanza et al. | ............... | 327/281 |
| 5,815,009 A * | 9/1998 | Iadanza et al. | ............... | 327/5 |
| 5,894,239 A * | 4/1999 | Bonaccio et al. | ............ | 327/176 |
| 6,169,438 B1 * | 1/2001 | Wu et al. | ............... | 327/276 |
| 6,680,636 B1 * | 1/2004 | Parry et al. | ............... | 327/161 |
| 6,741,106 B2 * | 5/2004 | Humphrey | ............... | 327/108 |
| 6,946,892 B2 * | 9/2005 | Mitarashi | ............... | 327/333 |
| 2007/0085577 A1 * | 4/2007 | Goldman | ............... | 327/112 |

FOREIGN PATENT DOCUMENTS

| | | |
|---|---|---|
| JP | S62-020423 | 1/1987 |
| JP | H07-106392 | 4/1995 |
| JP | 08-065140 A | 3/1996 |
| JP | 2000-232350 | 8/2000 |

* cited by examiner

*Primary Examiner*—Lincoln Donovan
*Assistant Examiner*—Adam D Houston
(74) *Attorney, Agent, or Firm*—Fujitsu Patent Center (57) ABSTRACT

A buffer circuit permitting an input signal to pass and prohibiting the input signal from passing corresponding to an output control signal, including an output switching device, a control portion having a first switching circuit controlling the output switching device into conductive state and a second switching circuit controlling the output switching device into non-conductive state, and controlling the output switching device into the conductive state or non-conductive state corresponding to the input signal and the output control signal, wherein a connecting point between the first switching circuit and the second switching circuit is coupled to the output switching device, and a changing portion connected to the second switching circuit in series and limiting the drive capacity of the output switching device when the output control signal is in an output prohibition state of prohibiting the input signal from passing.

6 Claims, 4 Drawing Sheets

CIRCUIT CONFIGURATION DIAGRAM OF TRI-STATE BUFFER ACCORDING TO THE EMBODIMENT OF PRESENT INVENTION

FIG.1

CIRCUIT SYMBOL DIAGRAM OF TRI-STATE BUFFER ACCORDING TO EMBODIMENT OF PRESENT INVENTION

FIG.2

CIRCUIT CONFIGURATION DIAGRAM OF TRI-STATE BUFFER ACCORDING TO THE EMBODIMENT OF PRESENT INVENTION

FIG.3

SIGNAL WAVEFORM DIAGRAM FOR EXPLAINING OPERATION OF TRI-STATE BUFFER OF THE EMBODIMENT

FIG.4

SCHEMATIC WAVEFORM DIAGRAM SHOWING CHANGES ID GROUNDING POTENTIAL IN TRI-STATE BUFFER OF THE EMBODIMENT

FIG.5

SCHEMATIC WAVEFORM DIAGRAM SHOWING CHANGES IN GROUNDING CURRENT IN TRI-STATE BUFFER OF THE EMBODIMENT

FIG.6 (PRIOR ART)

CIRCUIT CONFIGURATION DIAGRAM OF CONVENTIONAL TRI-STATE BUFFER

FIG.7 (PRIOR ART)

SIGNAL WAVEFORM DIAGRAM FOR EXPLAINING OPERATION OF CONVENTIONAL TRI-STATE BUFFER

FIG.8 (PRIOR ART)

SCHEMATIC WAVEFORM DIAGRAM SHOWING CHANGES IN GROUNDING POTENTIAL IN CONVENTIONAL TRI-STATE BUFFER

BUFFER CIRCUIT AND CONTROL METHOD THEREOF

CROSS-REFERENCE TO RELATED APPLICATIONS

This application is based upon and claims the benefit of priority from each of the prior Japanese Patent Application No. 2006-266312 filed on Sep. 29, 2006, the entire contents of which are incorporated herein by reference.

BACKGROUND

1. Field

The embodiments discussed herein are directed to a buffer circuit permitting an input signal to pass corresponding to an output control signal or prohibiting a passage of the input signal and a control method thereof.

2. Description of Related Art

As disclosed in Japanese Laid-open Patent Application No. 62(1987)-020423 and Japanese Laid-open Patent Application No. 2000-232350, there has been known a buffer circuit which permits an input signal to pass corresponding to an output control signal or prohibits a passage of the input signal. The Japanese Laid-open Patent Application No. 62(1987)-020423 has described a buffer circuit which comprises a first logical gate circuit in which a drive MOSFET on a reference potential side is placed in series so as to receive an output control signal and a signal to be sent to an external terminal, a second logical gate circuit in which a drive MOSFET on a reference potential side is placed in parallel so as to receive the output control signal and a signal to be sent to an external terminal and an output circuit comprising P channel MOSFET and N channel MOSFET which are driven to OFF state complementarily following an output signal of the first and second logical gate circuits or altogether.

The above-mentioned buffer circuit prevents the P channel MOSFET and the N channel MOSFET of the output circuit from being turned to ON state at the same time by using a time difference according to a difference of potential between a logic threshold voltage of the first logical gate circuit in which the drive MOSFET on the reference potential side is placed in series and a logic threshold voltage of a second logical gate circuit in which the drive MOSFET on the reference potential side is placed in parallel. Consequently, the above-mentioned buffer circuit can prevent a through current from flowing in the P channel MOSFET and N channel MOSFET.

The Japanese Laid-open Patent Application No. 2000-232350 has described a buffer circuit which turns a signal outputted by an output control circuit to a signal converting portion to a low level regardless of a value of data signal when it is controlled not to output any data signal from an output circuit by an enable signal which is an output control signal.

In the above-mentioned buffer circuit, the signal converting portion sends a high level signal to a gate of a P channel MOS transistor of the output circuit corresponding to the low level signal and further sends a low level signal to a gate of an N channel MOS transistor so as to turn both the transistors to OFF state. Consequently, in the above-mentioned buffer circuit, the P channel MOS transistor and the N channel MOS transistor are not turned to ON state at the same time, thereby preventing a through current from flowing to both the transistors.

Figure 6:
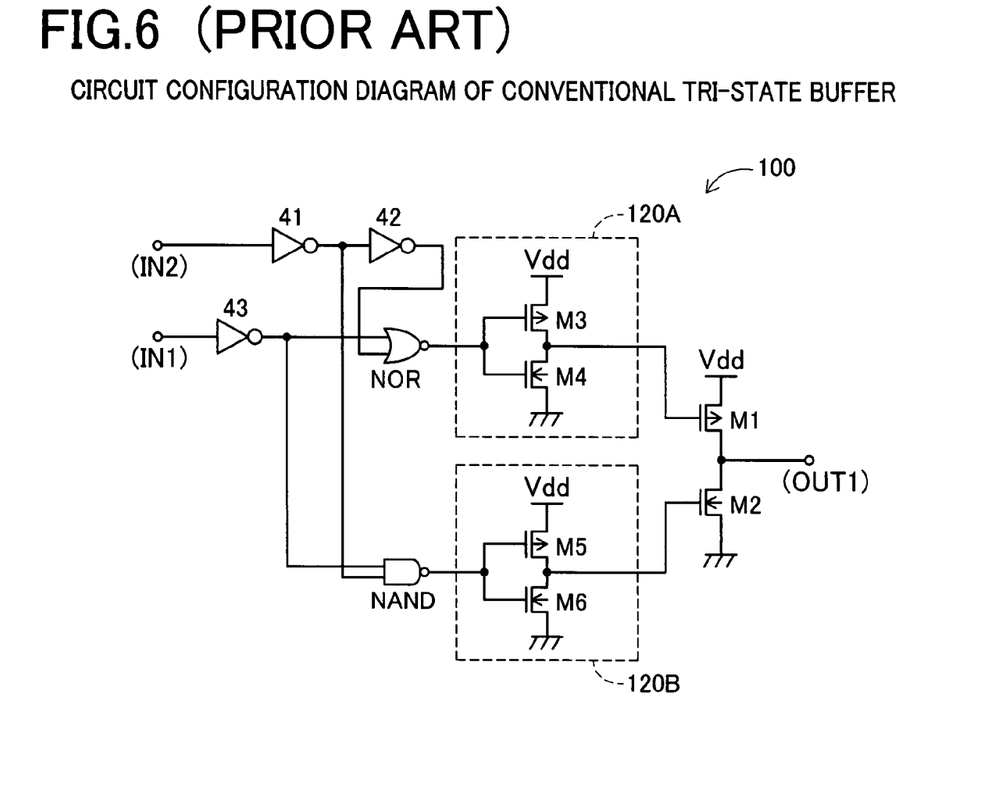
FIG. 6 is a circuit configuration diagram of a conventional tri-state-buffer.

A buffer circuit 100 shown in FIG. 6 includes gate voltage control circuits 120A, 120B for controlling each gate voltage of a P type channel transistor M1 and an N type channel transistor M2 which output a data signal to be inputted to an enable control input terminal (IN2) from a data output terminal (OUT1). In the gate voltage control circuit 120A, a current drive capacity of a P type channel transistor M3 is set larger than a current drive capacity of an N type channel transistor M4. Further, in the gate voltage control circuit 120B, a current drive capacity of an N type channel transistor M6 is set larger than a current drive capacity of a P type channel transistor M5.

The above-mentioned buffer circuit 100 operates as follows if a data signal changes from a low level to a high level when a circuit is so controlled that a low level enable signal is inputted from the enable control input terminal (IN2) and a data signal inputted from the data input terminal (IN1) is outputted from the data output terminal (OUT1).

Figure 7:
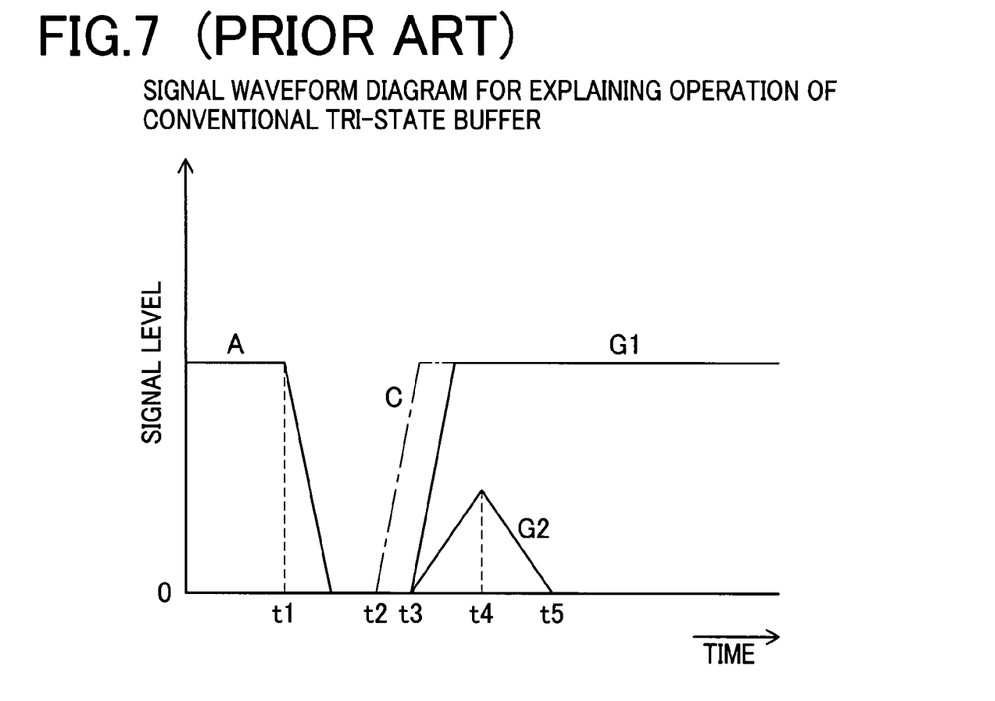
FIG. 7 is a signal waveform diagram for explaining the operation of the conventional tri-state-buffer.

In the above-mentioned buffer circuit 100, when a low level enable signal C is inputted from the enable control input terminal (IN2) and a high level data signal A is inputted from the data input terminal (IN1) in a period of time from 0 to t1 in FIG. 7 as shown in the Figure, a high level signal and a low level signal are inputted to a NAND gate circuit NAND. Reference numerals 41, 43 in the Figure indicate inverters. The NAND gate circuit NAND outputs a high level signal to each gate of the P type channel transistor M5 and the N type channel transistor M6. Consequently, after the N type channel transistor M6 whose current drive capacity is larger than, the P type channel transistor M5 is turned to ON state, the P type channel transistor M5 is turned to OFF state. Thus, a gate voltage G2 of the N type channel transistor M2 is fixed to a low level voltage so as to turn the N type channel transistor M2 to OFF state in a period of time 0 to t1 as shown in the Figure.

In the above-mentioned buffer circuit 100, after the N type channel transistor M2 is turned to OFF state, the P type channel transistor M1 is turned to ON state by an operation described below. In the meantime, reference numeral 42 denotes an inverter. As described above, if the low level enable signal is inputted from the enable control input terminal (IN2) and the high level data signal is inputted from the data input terminal (IN1), a NOR gate circuit NOR outputs a high level signal to each gate of the P type channel transistor M3 and the N type channel transistor M4. Consequently, after the P type channel transistor M3 whose current drive capacity is larger than the N type channel transistor M4 is turned to OFF state, the N type channel transistor M4 is turned to ON state. Thus, a gate voltage G1 of the P type channel transistor M1 is fixed to a low level voltage so as to turn the P type channel transistor M1 to ON state in a period of time 0-t1 as shown in the Figure.

As described above, in the buffer circuit 100, the both transistors M1, M2 are not turned to ON state at the same time because the P type channel transistor M1 is turned to ON state after the N type channel transistor M2 is turned to OFF state thereby preventing any through current from flowing to the both transistors M1 and M2.

SUMMARY

It is an aspect of the embodiments discussed herein to provide a buffer circuit permitting an input signal to pass and prohibiting the input signal from passing corresponding to an output control signal, including an output switching device, a control portion having a first switching circuit controlling the output switching device into conductive state and a second switching circuit controlling the output switching device into non-conductive state, and controlling the output switching device into the conductive state or non-conductive state corresponding to the input signal and the output control signal, wherein a connecting point between the first switching circuit and the second switching circuit is coupled to the output switching device, and a changing portion connected to the second switching circuit in series and limiting the drive capacity of the output switching device when the output control signal is in an output prohibition state of prohibiting the input signal from passing.

DETAILED DESCRIPTION OF THE PREFERRED EMBODIMENTS

The buffer circuit 100 described in related art operates as follows if the data signal A inputted from the data input terminal (IN1) changes from a high level to a low level when the low level enable signal C is inputted from the enable control input terminal (IN2).

A high level signal is inputted to the NAND gate circuit NAND of the buffer circuit 100 in case of all inputs. The NAND gate circuit NAND outputs a low level signal to each gate of the P type channel transistor M5 and the N type channel transistor M6. After the N type channel transistor M6 is turned to OFF state, the P type channel transistor M5 is turned to ON state. Consequently, the gate voltage G2 of the N type channel transistor M2 is fixed to a high level voltage so as to turn the N type channel transistor M2 to ON state. At this time, current flows to a ground through a source of the N type channel transistor M2.

On the other hand, the NOR gate circuit NOR outputs a low level signal to each gate of the P type channel transistor M3 and the N type channel transistor M4. After the P type channel transistor M3 is turned to ON state, the N type channel transistor M4 is turned to OFF state. Consequently, the gate voltage G1 of the P type channel transistor M1 is fixed to a high level voltage so as to turn the P type channel transistor M1 to OFF state.

The buffer circuit 100 operates as follows if the enable signal C inputted from the enable control input terminal (IN2) is changed from a low level to a high level to turn the data output terminal (OUT1) into a high impedance state while the data signal A inputted from the data input terminal (IN1) is being changed from a high level to a low level and the data signal outputted from the data output terminal (OUT1) is being changed from a high level to a low level.

In the buffer circuit 100, if the low level enable signal C is inputted from the enable control input terminal (IN2) and the low level data signal A is inputted from the data input terminal (IN1), the NAND circuit NAND outputs a low level signal to each gate of the P type channel transistor M5 and the N type channel transistor M6. Consequently, after the N type channel transistor M6 is turned to OFF state, the P type channel transistor M5 is turned to ON state. Thus, in a period of time from time t3 to t4, the gate voltage G2 is raised to turn the data signal outputted from the data output terminal (OUT1) to a low level with the gate voltage G2 of the N type channel transistor M2 fixed to a high level voltage.

After that, at time t2, if the high level enable signal C is inputted from the enable control input terminal (IN2), the NAND circuit NAND outputs a high level signal to each gate of the P type channel transistor M5 and the N type channel transistor M6. Then, after the N type channel transistor M6 is turned to ON state, the P type channel transistor M5 is turned to OFF state. Consequently, in the period of time t4-t5, the gate voltage G2 is dropped to a low level voltage (grounding potential) quickly so as to turn the data output terminal (OUT1) into a high impedance state with the gate voltage G2 of the N type channel transistor M2 fixed to a low level voltage. As a result, the N type channel transistor M2 in the ON state is turned to OFF state quickly.

Figure 8:
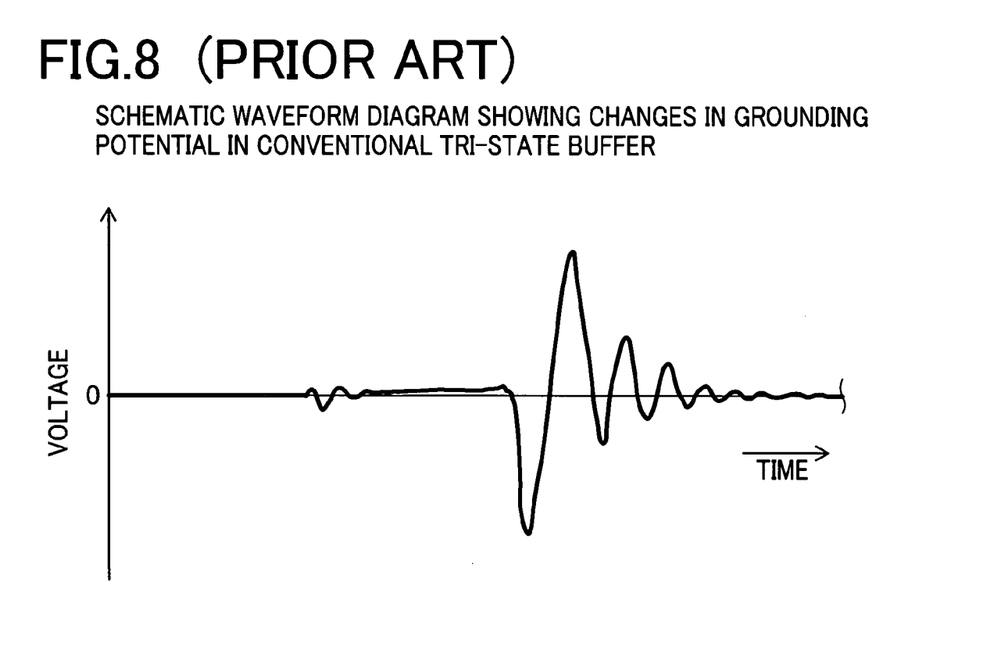
FIG. 8 is a schematic waveform diagram showing changes in grounding potential in the conventional tri-state-buffer.

In this case, the N type channel transistor M2 is changed from ON state to OFF state quickly so that a current flowing to the ground is shut down thereby changes of the current flowing to the ground per unit time being increased. Then, it can be considered that as shown in FIG. 8, a grounding potential changes in ringing form due to receiving influences of parasitic inductance components of a grounding wire possessed by the buffer circuit 100 or a level of data signal outputted from the data output terminal (OUT1) changes in the ringing form due to receiving influences of parasitic inductance components of an output wire. Further, in the buffer circuit 100, as well as the ringing-form changes of the level of the data signal, it can be considered that a voltage of a power supply line changes in the ringing form due to receiving influences of parasitic inductance components of a power supply wire. If the change of the grounding potential or the change of the power supply line voltage occurs, there is a fear that the level of the data signal inputted from the data input terminal (IN1) may not be recognized properly in the buffer circuit 100 and other logical circuit, so that the buffer circuit 100 or the like may be malfunctioned.

Figure 1:
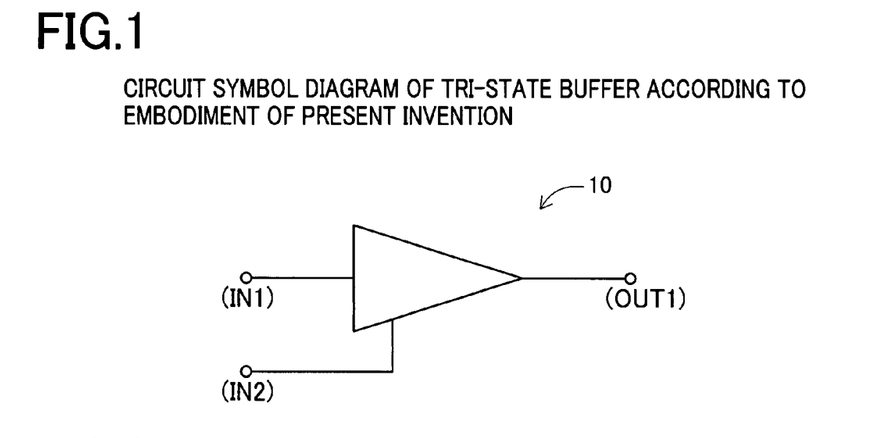
FIG. 1 is a circuit symbol diagram of a tri-state-buffer according to an embodiment.

The preferred embodiments will be described with reference to FIGS. 1, 2. The buffer circuit will be described by taking a tri-state-buffer 10 as an example. FIG. 1 is a circuit symbol diagram of the tri-state-buffer 10. Symbol (IN1) indicates a data input terminal, symbol (IN2) indicates an enable control input terminal and symbol (OUT1) indicates a data output terminal. In the tri-state-buffer 10, a signal outputted from a data output terminal (OUT1) is controlled to a high level or a low level and the data output terminal (OUT1) is controlled to a high impedance state corresponding to a level of an enable signal inputted from the enable control input terminal (IN2). In the meantime, the enable signal corresponds to an output control signal and a data signal inputted from the data input terminal (IN1) corresponds to an input signal.

Figure 2:
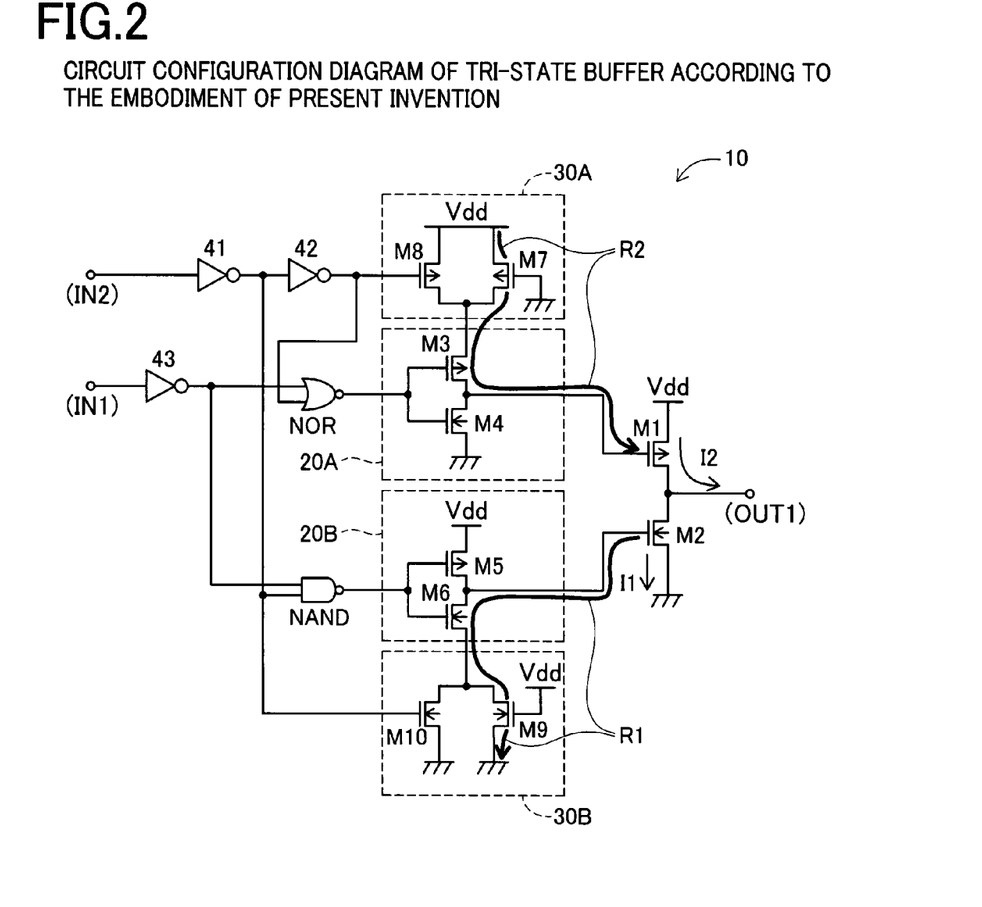
FIG. 2 is a circuit configuration diagram of the tri-state-buffer according to the embodiment.

FIG. 2 is a circuit configuration diagram of the tri-state-buffer 10. In the meantime, same reference numerals are attached to the same terminals as those shown in FIG. 1 and same reference numerals are attached to the same devices as those shown in FIG. 6. The tri-state-buffer 10 comprises a P type channel transistor M1, an N type channel transistor M2, gate voltage control circuits 20A, 20B and current drive capacity changing circuits 30A, 30B.

A source of the P type channel transistor M1 is connected to a power supply voltage Vdd (power supply line). A drain of the P type channel transistor M1 is connected to a drain of the N type channel transistor M2. A source of the N type channel transistor M2 is connected to a ground. Further, the drain of the P type channel transistor M1 and the drain of the N type channel transistor M2 are connected to a data output terminal (OUT1). A L/W size of the P type channel transistor M1 and the N type channel transistor M2 is set larger than a L/W size of each transistor M3-M10 described later. Consequently, a current drive capacity of the transistors M1, M2 becomes larger than a current drive capacity of the transistors M3-M10.

The gate voltage control circuit 20A includes a P type channel transistor M3 and an N type channel transistor M4. A drain of the P type channel transistor M3 is connected to a drain of the N type channel transistor M4. A source of the N type channel transistor M4 is connected to the ground. A connecting point between the drain of the P type channel transistor M3 and the drain of the N type channel transistor M4 is connected to a gate of the P type channel transistor M1.

The gate voltage control circuit 20B includes a P type channel transistor M5 and an N type channel transistor M6. A source of the P type channel transistor M5 is connected to the power supply voltage Vdd (power supply line). A drain of the P type channel transistor M5 is connected to a drain of the N type channel transistor M6. A connecting point between the drain of the P type channel transistor M5 and the drain of the N type channel transistor M6 is connected to a gate of the N type channel transistor M2.

The current drive capacity changing circuit 30A includes a P type channel transistor M7 and a P type channel transistor M8 connected to the transistor M7 in parallel. In this embodiment, the current drive capacity of the P type channel transistor M7 is set larger than the current drive capacity of the P type channel transistor M8. A source of the P type channel transistor M7 and a source of the P type channel transistor M8 are connected to the power supply voltage Vdd (power supply line). A gate of the P type channel transistor M7 is connected to the ground. Further, a drain of the P type channel transistor M7 and a drain of the P type channel transistor M8 are connected to a source of the P type channel transistor M3 provided on the gate voltage control circuit 20A in series.

The current drive capacity changing circuit 30B includes an N type channel transistor M9 and an N type channel transistor M10 connected to the transistor M9 in parallel. In this embodiment, the current drive capacity of the N type channel transistor M9 is set larger than the current drive capacity of the N type channel transistor M10. A source of the N type channel transistor M9 and a source of the N type channel transistor M10 are connected to the ground. A gate of the N type channel transistor M9 is connected to the power supply voltage Vdd (power supply line). Further, the drain of the N type channel transistor M9 and a drain of the N type channel transistor M10 are connected to a source of the N type channel transistor M6 of the gate voltage control circuit 20B in series.

In this embodiment, the current drive capacity of each transistor is set to satisfy the relation of the magnitude described below. Here, the current drive capacity of the P type channel transistor M1 is expressed with 1 which is part of the symbol M1 of the transistor and the current drive capacity of the other transistors is expressed with a number which is part of the symbol of each transistor.

1·2>3·6·10>4·5>7·9

The enable control input terminal (IN2) is connected to an input of an inverter 41. An output of the inverter 41 is connected to the input of an inverter 42, a second input of a NAND gate circuit NAND and a gate of the N type channel transistor M10 of the current drive capacity changing circuit 30B. The output of the inverter 42 is connected to a gate of the P type channel transistor M8 of the current drive capacity changing circuit 30A and a second input of a NOR gate circuit NOR.

The data input terminal (IN1) is connected to an input of an inverter 43. An output of the inverter 43 is connected to a first input of the NOR gate circuit NOR and a first input of the NAND gate circuit NAND. An output of the NOR gate circuit NOR is connected to a gate of the P type channel transistor M3 and a gate of the N type channel transistor M4 in the gate voltage control circuit 20A. An output of the NAND gate circuit NAND is connected to a gate of the P type channel transistor M5 and a gate of the N type channel transistor M6 in the gate voltage control circuit 20B.

Next, an operation of the tri-state-buffer 10 of this embodiment will be described. The tri-state-buffer 10 operates as follows if it is controlled to input a high level data signal from the data input terminal (IN1) and a low level enable signal from the enable control input terminal (IN2) and to output a high level data signal from the data output terminal (OUT1). In the meantime, a description of the same operation as the buffer circuit 100 shown in FIG. 6 is simplified.

In the tri-state-buffer 10, when an output of the inverter 41 is supplied to the gate of the N type channel transistor M10, the gate of the N type channel transistor M10 is fixed to a high level voltage so that the N type channel transistor M10 is turned to ON state. Further, the gate of the N type channel transistor M9 is fixed to a high level voltage by the power supply voltage Vdd so that the N type channel transistor M9 is turned to ON state.

Like the above-described buffer circuit 100, in the tri-state-buffer 10, after the N type channel transistor M6 whose current drive capacity is larger than the P type channel transistor M5 is turned to ON state, the P type channel transistor M5 is turned to OFF state. Consequently, the N type channel transistor M9 and the N type channel transistor M10 are kept in the ON state and further the N type channel transistor M6 is turned to ON state, so that a sink current passage to the N type channel transistor M2 is formed. Thus, the gate of the N type channel transistor M2 is fixed to a low level voltage, so that the N type channel transistor M2 is turned to OFF state. When the N type channel transistor M6 is turned to ON state, it fixes the gate of the N type channel transistor M2 to a low level voltage so as to turn the transistor M2 to OFF state. Thus, the N type channel transistor M6 corresponds to a second switching circuit.

After the N type channel transistor M2 is turned to OFF state, the P type channel transistor M1 is turned to ON state as described below. Like the above-described buffer circuit 100, after the P type channel transistor M3 whose current drive capacity is larger than the N type channel transistor M4 is turned to OFF state, the N type channel transistor M4 is turned to ON state. Consequently, a sink current passage to the P type channel transistor M1 is formed and the gate of the P type channel transistor M1 is fixed to a low level voltage so that the P type channel transistor M1 is turned to ON state and a current I2 flows. The N type channel transistor M4 corresponds to a first switching circuit because it fixes the gate of the P type channel transistor M1 to a low level voltage when it is turned to ON state, so as to turn the transistor M1 to ON state. The tri-state-buffer 10 turns the P type channel transistor M1 to ON state and further turns the N type channel transistor M2 to OFF state as described above, so that a high level data signal is outputted from the data output terminal (OUT1). In the meantime, the P type channel transistor M1 and the N type channel transistor M2 correspond to an output switching device.

When the P type channel transistor M1 is turned to ON state, an output of the inverter 42 is supplied to the gate of the P type channel transistor M8 and then the gate of the P type channel transistor M8 is fixed to a low level voltage, so that the P type channel transistor M8 is turned to ON state. Further, the gate of the P type channel transistor M7 is connected to the ground, the gate of the P type channel transistor M7 is fixed to a low level voltage and the P type channel transistor M7 is turned to ON state.

After that, the tri-state-buffer 10 of this embodiment operates as follows if it is controlled to change a data signal inputted from the data input terminal (IN1) from a high level to a low level with a low level enable signal inputted from the enable control input terminal (IN2) and to output a low level data signal from the data output terminal (OUT1).

In the tri-state-buffer 10, as described above, the gate of the N type channel transistor M10 is fixed to a high level voltage, the N type channel transistor M10 is turned to ON state, the gate of the N type channel transistor M9 is fixed to a high level voltage and the N type channel transistor M9 is tuned to ON state.

Like the above-described buffer circuit 100, in the tri-state-buffer 10, after the N type channel transistor M6 whose current drive capacity is larger than the P type channel transistor M5 is turned to OFF state, the P type channel transistor M5 is turned to ON state. Consequently, a source current passage to the N type channel transistor M2 is formed, the gate of the N type channel transistor M2 is fixed to a high level voltage, and the N type channel transistor M2 is turned to ON state so that the current I1 flows to the ground. The P type channel transistor M5 corresponds to a first switching circuit because the gate of the N type channel transistor M2 is fixed to a high level voltage when it is turned to ON state and the transistor M2 is turned to ON state.

Additionally, as described above, by an output of the inverter 42, the gate of the P type channel transistor M8 is fixed to a low level voltage, so that the P type channel transistor M8 is turned to ON state, the gate of the P type channel transistor M7 is fixed to a low level voltage and the P type channel transistor M7 is turned to ON state.

Like the above-described buffer circuit 100, after the P type channel transistor M3 whose current drive capacity is larger than the N type channel transistor M4 is turned to ON state, the N type channel transistor M4 is turned to OFF state. Consequently, the P type channel transistor M7 and the P type channel transistor M8 are turned to ON state and further the P type channel transistor M3 is turned to ON state so that a source current passage to the P type channel transistor M1 is formed. Thus, the gate of the P type channel transistor M1 is fixed to a high level voltage and the P type channel transistor M1 is turned to OFF state. The P type channel transistor M3 corresponds to the second switching circuit because it fixes the gate of the P type channel transistor M1 to a high level voltage when it is turned to ON state, so as to turn the transistor M1 to OFF state. The tri-state-buffer 10 turns the P type channel transistor M1 to OFF state and further turns the N type channel transistor M2 to ON state as described above, so that a low level data signal is outputted from the data output terminal (OUT1).

Further if the tri-state-buffer 10 of this embodiment, with a low level data signal inputted from the data input terminal (IN1), changes the enable signal inputted from the enable control input terminal (IN2) from a low level to a high level so as to turn the data output terminal (OUT1) into a high impedance state, it operates as follows to block the grounding potential from changing largely.

When an output of the inverter 41 is supplied to the gate of the N type channel transistor M10, the gate of the N type channel transistor M10 is fixed to a low level voltage so as to turn the N type channel transistor M10 to OFF state.

When the N type channel transistor M10 is turned to OFF state, the gate of the N type channel transistor M9 is fixed to a high level voltage by the power supply voltage Vdd, so that the N type channel transistor M9 is turned to ON state.

Like the above-described buffer circuit 100, the tri-state-buffer 10 turns the P type channel transistor M5 to OFF state after the N type channel transistor M6 is turned to ON state. Consequently, the P type channel transistor M5 is turned to OFF state and further the N type channel transistor M6 and the N type channel transistor M9 are turned to ON state, so that as shown in FIG. 2, a sink current passage R1 to the N type channel transistor M2 is formed. Then, the gate of the N type channel transistor M2 is fixed to a low level voltage and the N type channel transistor M2 in the ON state is turned to OFF state.

When the sink current passage R1 is formed, the N type channel transistor M10 is in the OFF state and no sink current passage to the ground formed by connecting the source of the N type channel transistor M6 to the source of the N type channel transistor M10 is formed in the tri-state-buffer 10, unlike the above-described case where a low level data signal is inputted from the enable control input terminal (IN2). Thus, as compared with a case of forming a sink current passage from the transistor M6 to the ground through the transistor M10 as well as the sink current passage R1, a current drive capacity of the sink current passage to the N type channel transistor M2 is reduced and the current drive capacity of the sink current passage for changing over the gate of the N type channel transistor M2 from a high level voltage to a low level voltage is reduced. In the meantime, reducing of the current drive capacity of the sink current passage to the N type channel transistor M2 means an increase of synthetic resistance value of the sink current passage to the transistor M2.

As described above, the N type channel transistor M10 corresponds to the first switching device because it is turned to OFF state when the data output terminal (OUT1) is turned into a high impedance state by a high level enable signal. The N type channel transistor M9 corresponds to the second switching device because it is connected in parallel to the N type channel transistor M10 and it is in the ON state when the data output terminal (OUT1) is turned into a high impedance state by the high level enable signal.

In this embodiment, a current drive capacity of the N type channel transistor M9 disposed on the sink current passage R1 is set smaller than a current drive capacity of the N type channel transistor M10 connected to the transistor M9 in parallel. In this embodiment, by disposing the N type channel transistor M9 on the sink current passage R1, the current drive capacity of the sink current passage R1 for changing over the gate of the N type channel transistor M2 from a high level voltage to a low level voltage is reduced as compared with a case where the current drive capacity of the N type channel transistor M9 is set equal to the current drive capacity of the N type channel transistor M10.

If the current drive capacity of the sink current passage R1 is reduced, a time period for the gate of the N type channel transistor M2 to be turned from a high level voltage to a low level voltage can be prolonged and changes of the current I1 per unit time can be suppressed as compared with a conventional case of shutting down the current I1 by changing over the gate of the transistor M2 from the high level voltage to the low level voltage quickly. Consequently, the changes of the current I1 per unit time is never increased so that the grounding potential and the level of the data signal outputted from the data output terminal (OUT1) are blocked from changing largely due to receiving influences of each parasitic inductance component of the grounding wire or output wire of the tri-state-buffer 10.

On the other hand, if a signal inputted from the enable control input terminal (IN2) is changed from a low level to a high level with a low level signal inputted from the data input terminal (IN1), as described above, the output of the inverter 42 is supplied to the gate of the P type channel transistor M8 so that the gate of the P type channel transistor M8 is fixed to a high level voltage so as to turn the P type channel transistor M8 to OFF state.

When the P type channel transistor M8 is turned to OFF state, as described above, the gate of the P type channel transistor M7 is fixed to a low level voltage and the P type channel transistor M7 is kept in the ON state.

Further, after the output of the NOR gate circuit NOR is supplied to the gate of the P type channel transistor M3 and the gate of the N type channel transistor M4 so that the P type channel transistor M3 is turned to ON state, the N type channel transistor M4 is turned to OFF state. Consequently, the P type channel transistor M3 and the P type channel transistor M7 are kept in the ON state and further the N type channel transistor M4 is turned to OFF state, so that the source current passage R2 is formed as shown in FIG. 2. Then, the gate of the P type channel transistor M1 is fixed to a high level voltage and the P type channel transistor M1 in the ON state is turned to OFF state. The tri-state-buffer 10 turns the P type channel transistor M1 to OFF state and further turns the N type channel transistor M2 to OFF state as described above, so that the data output terminal (OUT1) is turned into the high impedance state.

If the tri-state-buffer 10 of this embodiment changes the enable signal inputted from the enable control input terminal (IN2) from a low level to a high level so as to turn the data output terminal (OUT1) into a high impedance state while data signal inputted from the data input terminal (IN1) is being changed from a high level to a low level and the data signal outputted from the data output terminal (OUT1) is being changed from a high level to a low level, it operates as follows so as to prevent the value of the power supply voltage Vdd from changing largely. Description of a portion overlapping the operation of the above-described tri-state-buffer 10 is simplified.

In the tri-state-buffer 10, when the output of the inverter 42 is supplied to the gate of the P type channel transistor M8, the gate of the P type channel transistor M8 is fixed to a high level voltage so as to turn the P type channel transistor M8 to OFF state. The gate of the P type channel transistor M7 is fixed to a low level voltage so as to keep the P type channel transistor M7 in the ON state.

As described above, the P type channel transistor M3 and the P type channel transistor M7 are kept in the ON state and further the N type channel transistor M4 is turned to OFF state, so that the source current passage R2 is formed and the P type channel transistor M1 in the ON state is turned to OFF state.

When the source current passage R2 is formed, the P type channel transistor M8 is in the OFF state and no source current passage leading from the power supply voltage Vdd to the P type channel transistor M3 through the P type channel transistor M8 is formed in the tri-state-buffer 10, unlike a case where a low level data signal is inputted from the enable control input terminal (IN2). Thus, in this embodiment, as compared with a case of forming the source current passage leading from the power supply voltage Vdd to the transistor M3 through the transistor M8 as well as the source current passage R2, the current drive capacity of the source current passage to the P type channel transistor M1 is reduced and the current drive capacity of the source current passage for changing over the gate of the P type channel transistor M1 from a low level voltage to a high level voltage is reduced. In the meantime, reducing the current drive capacity of the source current passage to the P type channel transistor M1 means an increase in synthetic resistance value of the source current passage to the transistor M1.

As described above, the P type channel transistor M8 corresponds to the first switching device because it is turned to OFF state when it turns the data output terminal (OUT1) into the high impedance state by a high level enable signal. The P type channel transistor M7 corresponds to the second switching device because it is connected to the P type channel transistor M8 in parallel and kept in the ON state when it turns the data output terminal (OUT1) into the high impedance state by a high level enable signal.

In this embodiment, the current drive capacity of the P type channel transistor M7 disposed on the source current passage R2 is set smaller than the current drive capacity of the P type channel transistor M8 connected to the transistor M7 in parallel. Thus, by disposing the P type channel transistor M7 on the source current passage R2, the current drive capacity of the source current passage R2 of changing over the gate of the P type channel transistor M1 from a low level voltage to a high level voltage can be reduced as compared with a case where the current drive capacity of the P type channel transistor M7 is set equal to the current drive capacity of the P type channel transistor M8.

If the current drive capacity of the source current passage R2 is reduced, a time period for the gate of the P type channel transistor M1 to be turned from a low level voltage to a high level voltage can be prolonged and changes of the current I2 per unit time can be suppressed as compared with a conventional case of shutting down the current I2 by changing over the gate of the transistor M1 from the low level voltage to the high level voltage quickly. Consequently, the changes of the current I2 per unit time is never increased so that the value of the power supply voltage Vdd and the level of the data signal outputted from the data output terminal (OUT1) are blocked from changing largely due to receiving influences of each inductance component of the power supply wire or output wire of the tri-state-buffer 10.

Figure 3:
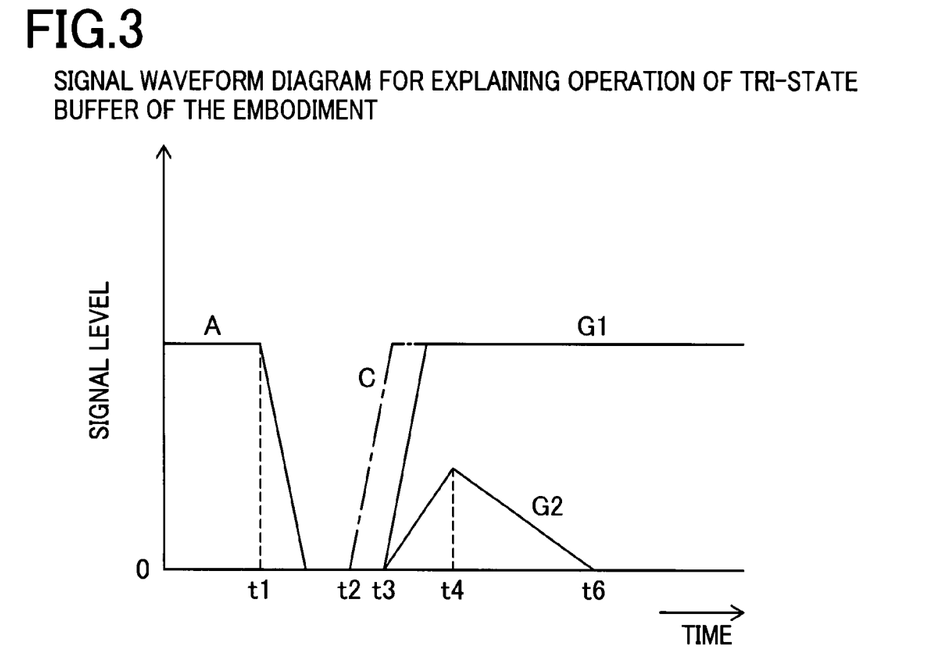
FIG. 3 is a signal waveform diagram for explaining the operation of the tri-state-buffer of the embodiment.

On the other hand, as shown in FIG. 3, if enable signal C inputted from the enable control input terminal (IN2) is changed from a high level to a low level at time t1, while data signal A inputted from the data input terminal (IN1) is being changed from high level to low level and data signal outputted from the data output terminal (OUT1) is being changed from a high level to a low level, the tri-state-buffer 10 operates as follows. Here, a description of the same operation as in the buffer circuit 100 shown in FIG. 6 is simplified. In the tri-state-buffer 10, an output of an inverter 41 is supplied to the gate of the N type channel transistor M10, so that the gate of the N type channel transistor M10 is fixed to a low level voltage so as to turn the N type channel transistor M10 to OFF state. When the N type channel transistor M10 is turned to OFF state, the gate of the N type channel transistor M9 is fixed to a high level voltage by the power supply voltage Vdd and the N type channel transistor M9 is kept in the ON state.

Further, as described above in a period of time of t1-t2, the P type channel transistor M5 is turned to ON state after the N type channel transistor M6 is turned to OFF state. After that, a gate voltage G2 of the N type channel transistor M2 is raised in a period of time of t3-t4 as described above.

Subsequently, if a high level enable signal C is inputted from the enable control input terminal (IN2) at time t2, as described above, after the N type channel transistor M6 is turned to ON state, the P type channel transistor M5 is turned to OFF state. Thus, in a period of time t4-t6, the N type channel transistor M9 is kept in the ON state, the sink current passage R1 is formed as shown in FIG. 2 and the gate voltage G2 drops to a low level voltage (grounding potential). Consequently, the N type channel transistor M2 is turned to OFF state. The tri-state-buffer 10 maintains the N type channel transistor M2 in the OFF state and further turns the P type channel transistor M1 to OFF state as described above. Consequently, the data output terminal (OUT1) is turned into a high impedance state.

Figure 4:
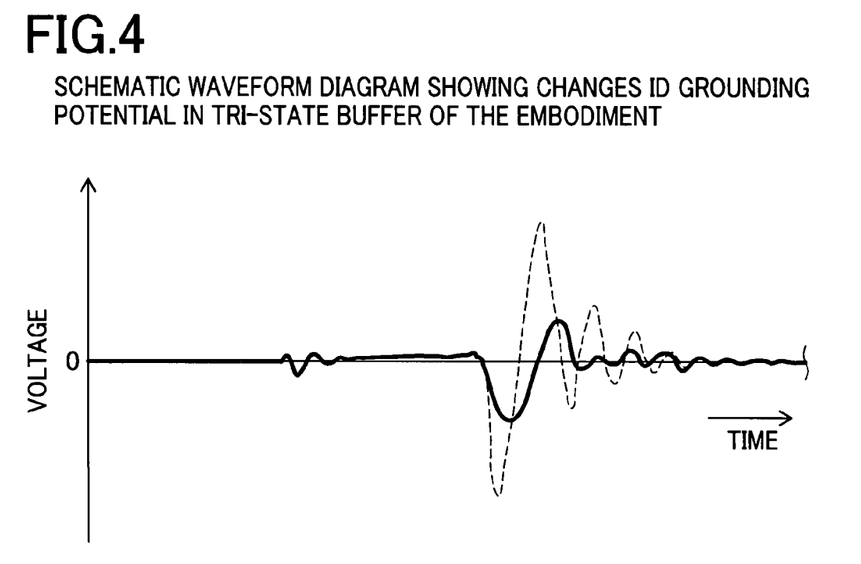
FIG. 4 is a schematic waveform diagram showing changes in grounding potential in the tri-state-buffer of the embodiment.
Figure 5:
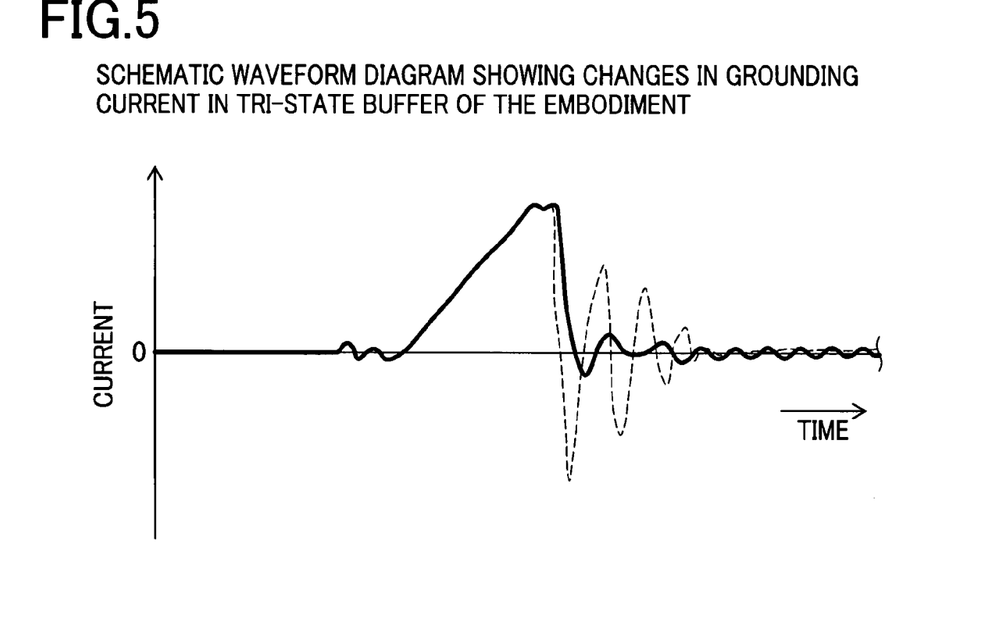
FIG. 5 is a schematic waveform diagram showing changes in grounding current in the tri-state-buffer of the embodiment.

In the tri-state-buffer 10 of this embodiment, as compared with a case of forming the sink current passage leading from the transistor M6 to the ground through the transistor M10 as well as the sink current passage R1, the current drive capacity of the sink current passage to the N type channel transistor M2 is reduced. Consequently, the period of time t4-t6 until the gate voltage G2 is lowered to a low level voltage (grounding potential) can be made longer than the period of time t4-t5 (see FIG. 7) until the conventional buffer circuit 100 lowers the gate voltage G2 to the low level voltage (grounding potential). As a result, the tri-state-buffer 10 of this embodiment can prevent the N type channel transistor M2 from being changed from ON state to OFF state quickly as compared with the conventional buffer circuit 100. Then, the changes in the current I1 (solid line in the Figure) per unit time can be suppressed as compared with a case of turning the N type channel transistor M2 from ON state to OFF state quickly in the conventional buffer circuit 100 (dotted line in the Figure). Thus, the grounding potential (solid line in the Figure) of the tri-state-buffer 10 of this embodiment can be prevented from being changed due to receiving influences of parasitic inductance component of grounding wire as compared with a case of the changes in the grounding potential (dotted line in the Figure) of the conventional buffer circuit 100 as shown in FIG. 4. Additionally, in this embodiment, a level of data signal outputted from the data output terminal (OUT1) can be blocked from being changed largely due to receiving influences of the parasitic inductance of the output wire of the tri-state-buffer 10.

In this embodiment, by an output of the NOR gate circuit in which data signal and enable signal are inputted, the P type channel transistor M3 and the N type channel transistor M4 provided on the gate voltage control circuit 20A are controlled to ON/OFF so as to form a sink current passage and a source current passage with respect to the P type channel transistor M1 and the gate voltage control circuit 20A fixes the gate of the P type channel transistor M1 to a high level voltage or a low level voltage so as to turn the transistor M1 to ON state or OFF state. Thus, the gate voltage control circuit 20A corresponds to an output switching device control portion. Further, in this embodiment, by an output of the NAND gate circuit NAND in which data signal and enable signal are inputted, the P type channel transistor M5 and the N type channel transistor M6 provided on the gate voltage control circuit 20B are controlled to ON/OFF so as to form a sink current passage and a source current passage to the N type channel transistor M2 and then, the gate voltage control circuit 20B fixes the gate of the N type channel transistor M2 to a high level voltage or a low level voltage so as to turn the transistor M2 to ON state or OFF state. Therefore, the gate voltage control circuit 20B corresponds to the output switching device control portion.

As described above, the gate voltage control circuit 20A's fixing the gate of the P type channel transistor M1 to a high level voltage or a low level voltage so as to turn the transistor M1 to OFF state or ON state and gate voltage control circuit 20B's fixing the gate of the N type channel transistor M2 to a high level voltage or a low level voltage so as to turn the transistor M2 to ON state or OFF state corresponds to an output switching device control step.

In this embodiment, when the data output terminal (OUT1) is turned into a high impedance state by a high level enable signal, the P type channel transistor M8 equipped on the current drive capacity changing circuit 30A is turned to OFF state so as to reduce the current drive capacity of the source current passage for changing over the gate of the P type channel transistor M1 from a low level voltage to a high level voltage. Therefore, the current drive capacity changing circuit 30A corresponds to a drive capacity changing portion. Further, in this embodiment, when the data output terminal (OUT1) is turned into a high impedance state by a high level enable signal, the N type channel transistor M10 equipped on the current drive capacity changing circuit 30B is turned to OFF state in order that the current drive capacity changing circuit 30B reduces the current drive capacity of the sink current passage for changing over the gate of the N type channel transistor M2 from a high level voltage to a low level voltage. Therefore, the current drive capacity changing circuit 30B corresponds to a drive capacity changing portion.

As described above, the current drive capacity changing circuit 30A's reducing the current drive capacity of the source current passage so as to change over the gate of the P type channel transistor M1 from a low level voltage to a high level voltage and current drive capacity changing circuit 30B's reducing the current drive capacity of the sink current passage so as to change over the gate of the N type channel transistor M2 from a high level voltage to a low level voltage corresponds to a drive capacity changing step.

The tri-state-buffer 10 of this embodiment exerts following effects if an enable signal inputted from the enable control input terminal (IN2) is changed from a low level to a high level with a low level data signal inputted from the data input terminal (IN1) or if the enable signal inputted from the enable control input terminal (IN2) is changed from a low level to a high level while data signal inputted from the data input terminal (IN1) is being changed from a high level to a low level and data signal outputted from the data output terminal (OUT1) is being changed from a high level to a low level. In the tri-state-buffer 10 of this embodiment, if the current drive capacity changing circuit 30A reduces the current drive capacity of the source current passage which fixes the gate of the P type channel transistor M1 to a high level voltage, a period of time until the gate of the P type channel transistor M1 is changed over from a low level voltage to a high level voltage is prolonged so that the P type channel transistor M1 is changed from ON state to OFF state slowly thereby suppressing changes of the current I2 flowing in the P type channel transistor M1 per unit time. Further, in the tri-state-buffer 10 of this embodiment, if the current drive capacity changing circuit 30B reduces the current drive capacity of the sink current passage which fixes the gate of the N type channel transistor M2 to a low level voltage, a period of time until the gate of the N type channel transistor M2 is changed over from a high level voltage to a low level voltage is prolonged so that the N type channel transistor M2 is changed from ON state to OFF state slowly thereby suppressing changes of the current I1 flowing in the N type channel transistor M2 per unit time. In the tri-state-buffer 10 of this embodiment, the change of the current I1 per unit time is never increased and the grounding potential and a level of data signal outputted from the data output terminal (OUT1) are blocked from being changed largely due to receiving influences of each parasitic inductance component of the grounding wire and output wire of the tri-state-buffer. Further, the change of the current I2 per unit time is never increased and the value of the power supply voltage Vdd and a level of data signal outputted from the data output terminal (OUT1) are blocked from being changed largely due to receiving influences of each inductance component of the power supply wire and output wire of the tri-state-buffer 10. Consequently, a difference of potential between the grounding potential and power supply line can be maintained within a range of specified values thereby blocking the tri-state-buffer 10 from being malfunctioned.

Further, because in the tri-state-buffer 10 of this embodiment, as described above, the level of the data signal outputted from the data output terminal (OUT1) is blocked from being changed largely, a logical circuit connected to the tri-state-buffer 10 can recognize the level of the data signal properly thereby blocking the logical circuit from being malfunctioned.

The control method of the tri-state-buffer 10 of this embodiment exerts following effects if the enable signal inputted from the enable control input terminal (IN2) is changed from a low level to a high level with a low level data signal inputted from the data input terminal (IN1) or if the enable signal inputted from the enable control input terminal (IN2) is changed from a low level to a high level while the data signal inputted from the data input terminal (IN1) is being changed from a high level to a low level and the data signal outputted from the data output terminal (OUT1) is being changed from a high level to a low level. According to the control method of the tri-state-buffer 10 of this embodiment, if the current drive capacity of the source current passage which fixes the gate of the P type channel transistor M1 to a high level voltage is reduced by drive capacity changing step executed by the current drive capacity changing circuit 30A, a period of time until the gate of the P type channel transistor M1 is changed over from a low level voltage to a high level voltage is prolonged so that the P type channel transistor M1 can be changed from ON state to OFF state slowly thereby suppressing changes of the current I2 flowing in the P type channel transistor M1 per unit time. Further, according to the control method of the tri-state-buffer 10 of this embodiment, if the current drive capacity of the sink current passage which fixes the gate of the N type channel transistor M2 to a low level voltage is reduced by the drive capacity changing step executed by the current drive capacity changing circuit 30B, a period of time until the gate of the N type channel transistor M2 is changed over from a high level voltage to a low level voltage is prolonged so that the N type channel transistor M2 can be changed from ON state to OFF state slowly thereby suppressing changes of the current I1 flowing in the N type channel transistor M2 per unit time. According to the control method of the tri-state-buffer 10 of this embodiment, the change of the current I1 per unit time is never increased and the grounding potential and the level of data signal outputted from the data output terminal (OUT1) are blocked from being changed largely due to receiving influences of each parasitic inductance component of the grounding wire and output wire of the tri-state-buffer 10. Further, the change of the current I2 per unit time is never increased and the value of the power supply voltage Vdd and the level of data signal outputted from the data output terminal (OUT1) are blocked from being changed largely due to receiving influences of each inductance component of the power supply wire and output wire of the tri-state-buffer 10. Consequently, a difference of potential between the grounding potential and power supply line can be maintained within a range of specified values thereby blocking the tri-state-buffer 10 from being malfunctioned.

Because according to the control method of the tri-state-buffer 10 of this embodiment, as described above, the level of the data signal outputted from the data output terminal (OUT1) is blocked from being changed largely, a logical circuit connected to the tri-state-buffer 10 can recognize the level of the data signal properly thereby blocking the logical circuit from being malfunctioned.

In the tri-state-buffer 10 of this embodiment, when the data output terminal (OUT1) is turned into the high impedance state by a high level enable signal, the P type channel transistor M8 and the N type channel transistor M10 are turned to OFF state and the P type channel transistor M7 and the N type channel transistor M9 connected to the respective transistors M8, M10 in parallel are turned to ON state so as to form the source current passage R2 and the sink current passage R1. In the tri-state-buffer 10 of this embodiment, when the data output terminal (OUT1) is turned into the high impedance state, the sink current passage R1 and the source current passage R2 are formed to exert the current drive capacities of the respective transistors M9, M7. In this case, by turning the N type channel transistor M10 and the N type channel transistor M8 to ON state, the current drive capacity of the source current passage to the P type channel transistor M1 and the current drive capacity of the sink current passage to the N type channel transistor M2 are reduced as compared with a case of forming the sink current passage in which the transistor M10 is disposed and the source current passage in which the transistor M8 is disposed as well as the sink current passage R1 and the source current passage R2. Thus in the tri-state-buffer 10 of this embodiment, the current drive capacity of the source current passage for changing over the P type channel transistor M1 from ON state to OFF state is reduced by changing over the gate of the P type channel transistor M1 from a low level voltage to a high level voltage thereby suppressing changes of the current I2 flowing in the P type channel transistor M1 per unit time. Additionally, the tri-state-buffer 10 of this embodiment can reduce the current drive capacity of the sink current passage for changing the N type channel transistor M2 from ON state to OFF state by changing over the gate of the N type channel transistor M2 from a high level voltage to a low level voltage thereby suppressing changes of the current I1 flowing in the N type channel transistor M2 per unit time.

According to the control method of the tri-state-buffer 10 of this embodiment, the P type channel transistor M8 and the N type channel transistor M10 are turned to OFF state by the drive capacity changing step when the data output terminal (OUT1) is turned into the high impedance state by a high level enable signal and the P type channel transistor M7 and the N type channel transistor M9 connected to the transistors M8, M10 respectively in parallel are turned to ON state, so as to form the source current passage R2 and the sink current passage R1. According to the control method of the tri-state-buffer 10 of this embodiment, when the data output terminal (OUT1) is turned into the high impedance state, the sink current passage R1 and the source current passage R2 are formed so as to exert the current drive capacity of the transistors M9, M7. In this case, by turning the N type channel transistor M10 and the N type channel transistor M8 to ON state, the current drive capacity of the source current passage to the P type channel transistor M1 and the current drive capacity of the sink current passage to the N type channel transistor M2 are reduced as compared with a case of forming the sink current passage in which the transistor M10 is disposed and the source current passage in which the transistor M8 is disposed as well as the sink current passage R1 and the source current passage R2. Thus, according to the control method of the tri-state-buffer 10 of this embodiment, by changing over the gate of the P type channel transistor M1 from a low level voltage to a high level voltage, the current drive capacity of the source current passage for changing the P type channel transistor M1 from ON state to OFF state is reduced thereby suppressing changes of the current I2 flowing in the P type channel transistor M1 per unit time. Additionally, according to the control method of the tri-state-buffer 10 of this embodiment, by changing over the gate of the N type channel transistor M2 from a high level voltage to a low level voltage, the current drive capacity of the sink current passage for changing the N type channel transistor M2 from ON state to OFF state is reduced thereby suppressing changes of the current I1 flowing in the N type channel transistor M2 per unit time.

In the tri-state-buffer 10 of this embodiment, the current drive capacity of the N type channel transistor M9 disposed in the sink current passage R1 is set smaller than the current drive capacity of the N type channel transistor M10 connected to the transistor M9 in parallel and the current drive capacity of the P type channel transistor M7 disposed in the source current passage R2 is set smaller than the current drive capacity of the P type channel transistor M8 connected to the transistor M7 in parallel. In the tri-state-buffer 10 of this embodiment, the current drive capacity of the sink current passage R1 for changing the N type channel transistor M2 from ON state to OFF state by changing over the gate of the N type channel transistor M2 from a high level voltage to a low level voltage can be reduced as compared with a case where the current drive capacity of the N type channel transistor M9 is set equal to the current drive capacity of the N type channel transistor M10 by disposing the N type channel transistor M9 on the sink current passage R1 when the data output terminal (OUT1) is turned into the high impedance state by a high level enable signal. Additionally, in the tri-state-buffer 10 of this embodiment, the current drive capacity of the source current passage R2 for changing the P type channel transistor M1 from ON state to OFF state by changing over the gate of the P type channel transistor M1 from a low level voltage to a high level voltage can be reduced as compared with a case where the current drive capacity of the P type channel transistor M7 is set equal to the current drive capacity of the P type channel transistor M8 by disposing the P type channel transistor M7 on the source current passage R2 when the data output terminal (OUT1) is turned into the high impedance state by a high level enable signal.

According to the control method of the tri-state-buffer 10 of this embodiment, the current drive capacity of the N type channel transistor M9 disposed in the sink current passage R1 is set smaller than the current drive capacity of the N type channel transistor M10 connected to the transistor M9 in parallel and the current drive capacity of the P type channel transistor M7 disposed in the source current passage R2 is set smaller than the current drive capacity of the P type channel transistor M8 connected to the transistor M7 in parallel. According to the control method of the tri-state-buffer 10 of this embodiment, the current drive capacity of the sink current passage R1 for changing the N type channel transistor M2 from ON state to OFF state by changing over the gate of the N type channel transistor M2 from a high level voltage to a low level voltage can be reduced as compared with a case where the current drive capacity of the N type channel transistor M9 is set equal to the current drive capacity of the N type channel transistor M10 by disposing the N type channel transistor M9 on the sink current passage R1 when the data output terminal (OUT1) is turned into the high impedance state by a high level enable signal. Additionally, according to the control method of the tri-state-buffer 10 of this embodiment, the current drive capacity of the source current passage R2 for changing the P type channel transistor M1 from ON state to OFF state by changing over the gate of the P type channel transistor M1 from a low level voltage to a high level voltage can be reduced as compared with a case where the current drive capacity of the P type channel transistor M7 is set equal to the current drive capacity of the P type channel transistor M8 by disposing the P type channel transistor M7 on the source current passage R2 when the data output terminal (OUT1) is turned into the high impedance state by a high level enable signal.

The tri-state-buffer 10 of the above-described embodiment is constituted as follows.

(1) A buffer circuit according to claim 1 or 2 wherein the output switching device is a first N type channel transistor in which an output terminal which allows the input signal to pass through is connected to a drain thereof while its source is connected to the ground;

the first switching circuit is a first P type channel transistor whose source is connected to a power supply line and the second switching circuit is a second N type channel transistor;

a gate of the first N type channel transistor is connected to a connecting point between the drain of the first P type channel transistor and the drain of the second N type channel transistor and a logical product inversion signal of the input signal and the output control signal are inputted to the gate of the first P type channel transistor and the gate of the second N type channel transistor;

the first switching device is a third N type channel transistor and the second switching device is a fourth N type channel transistor whose current drive capacity is smaller than the third N type channel transistor;

the output control signal is inputted to the gate of the third N type channel transistor, the source of the third N type channel transistor is connected to the ground, and a connecting point between the drain of the third N type channel transistor and the drain of the fourth N type channel transistor is connected to the source of the second N type channel transistor; and the gate of the fourth N type channel transistor is connected to a power supply line and the source of the fourth N type channel transistor is connected to the ground.

(2) A buffer circuit according to claim 1 or 2 wherein the output switching device is a second P type channel transistor in which an output terminal which allows the input signal to pass through is connected to a drain thereof while its source is connected to a power supply line;

the first switching circuit is a fifth N type channel transistor whose source is connected to the ground and the second switching circuit is a third P type channel transistor;

a gate of the second P type channel transistor is connected to a connecting point between the drain of the fifth N type channel transistor and the drain of the third P type channel transistor and a logical addition inversion signal of the input signal and the output control signal are inputted to the gate of the fifth N type channel transistor and the gate of the third P type channel transistor;

the first switching device is a fourth P type channel transistor and the second switching device is a fifth P type channel transistor whose current drive capacity is smaller than the fourth P type channel transistor;

the output control signal is inputted to the gate of the fourth P type channel transistor, the source of the fourth P type channel transistor is connected to the power supply line, and a connecting point between the drain of the fourth P type channel transistor and the drain of the fifth P type channel transistor is connected to the source of the third P type channel transistor; and the gate of the fifth P type channel transistor is connected to the ground and the source of the fifth P type channel transistor is connected to the power supply line.

A present invention is not restricted to the above-described embodiments but may be carried out by modifying part of its composition appropriately within a range not departing from the spirit of the invention. For example, unlike the above-described embodiments, the tri-state-buffer may comprise a current drive capacity changing circuit having two or more P type channel transistors M8 and a P type channel transistor M7 and a current drive capacity changing circuit having two or more N type channel transistors M10 and a N type channel transistor M9. When the enable signal inputted from the enable control input terminal (IN2) is changed from a low level to a high level so as to turn the data output terminal (OUT1) into the high impedance state, the P type channel transistor M7 and the N type channel transistor M9 may be turned to ON state while at least one of two or more P type channel transistors M8 and at least one of two or more N type channel transistors M10 are turned to OFF state.

When a high level signal is inputted from the enable control input terminal (IN2), by turning at least one P type channel transistor M8 and P type transistor M7 to the ON state, this tri-state-buffer can reduce the current drive capacity of the source current passage to the P type channel transistor M1 so that the gate of the P type channel transistor M1 is changed over from a low level voltage to a high level voltage to reduce the current drive capacity of the source current passage for turning the P type channel transistor M1 from ON state to OFF state, as compared with a case where all the transistors M8 and the transistor M7 are in the ON state. Then, by prolonging the period of time until the gate of the P type channel transistor M1 is changed over from a low level voltage to a high level voltage, the P type channel transistor M1 can be moved from ON state to OFF state slowly so that changes in the current I2 per time unit can be suppressed. Additionally, when a high level signal is inputted from the enable control input terminal (IN2), by turning at least one N type channel transistor M10 and N type transistor M9 to the ON state, the above-mentioned tri-state-buffer can reduce the current drive capacity of the sink current passage to the N type channel transistor M2 so that the gate of the N type channel transistor M2 is changed over from a high level voltage to a low level voltage to reduce the current drive capacity of the sink current passage for turning the N type channel transistor from ON state to OFF state, as compared with a case where all the transistors M10 and the transistor M9 are in the ON state. Then, by prolonging the period of time until the gate of the N type channel transistor M2 is changed over from a high level voltage to a low level voltage, the N type channel transistor M2 can be moved from ON state to OFF state slowly, so that changes in the current I1 per unit time can be suppressed.

According to the buffer circuit and its control method, the output control signal turns into an output prohibition state of prohibiting the input signal from passing through at a timing in which the input signal passing through the buffer circuit is changed by receiving a transition of the input signal. If the drive capacity of the output switching device is limited, the output switching device can be moved from a conductive state to a non-conductive state slowly so that the output switching device is never changed from the conductive state to the non-conductive state quickly thereby suppressing changes in current passing in the output switching device per unit time. Thus according to the buffer circuit and its control method, changes in the grounding potential and the voltage of power supply line due to output switching device's changing from the conductive state to the non-conductive state can be suppressed so that a difference of potential between the grounding potential and the power supply line can be maintained at specified values thereby preventing the buffer circuit from being malfunctioned.

What is claimed is:

1. A buffer circuit permitting an input signal to pass and prohibiting the input signal from passing corresponding to an output control signal, comprising:

an output switching device;

a control portion having a first switching circuit controlling the output switching device into conductive state and a second switching circuit controlling the output switching device into non-conductive state, and controlling the output switching device into the conductive state or non-conductive state corresponding to the input signal and the output control signal, wherein a connecting point between the first switching circuit and the second switching circuit is coupled to the output switching device; and a changing portion connected to the second switching circuit in series and limiting the drive capacity of the output switching device when the output control signal is in an output prohibition state of prohibiting the input signal from passing.

2. The buffer circuit according to claim 1 wherein the changing portion includes a first switching device turning into the non-conductive state when the output control signal is in the output prohibition state and a second switching device coupled to the first switching device in parallel so that it is in the conductive state.

3. The buffer circuit according to claim 2 wherein the drive capacity of the second switching device is smaller than the drive capacity of the first switching device.

4. A control method, comprising:

controlling an output switching device to conductive state or non-conductive state corresponding to the input signal and the output control signal; and limiting the drive capacity of the output switching device when the output control signal is in the output prohibition state of prohibiting the input signal from passing.

5. The control method according to claim 4 wherein the limiting the drive capacity turns at least a switching device into the non-conductive state when the output control signal is in the output prohibition state and turns the switching device coupled to the switching device in the non-conductive state in parallel into the conductive state.

6. The control method according to claim 5 wherein the drive capacity of the switching device in the conductive state is smaller than the drive capacity of at least a switching device.

* * * * *